United States Patent
Ishio et al.

(10) Patent No.: US 6,809,527 B2
(45) Date of Patent: Oct. 26, 2004

(54) METHOD OF MEASURING A CHARACTERISTIC OF A CAPACITIVE TYPE OF SENSOR, A SENSOR CHARACTERISTIC MEASURING APPARATUS, A CAPACITIVE TYPE OF SENSOR APPARATUS, AND AN IC CHIP FOR MEASURING A SENSOR CHARACTERISTIC

(75) Inventors: Seiichiro Ishio, Kariya (JP); Yasutoshi Suzuki, Okazaki (JP); Hajime Ito, Ichinomiya (JP); Yasuaki Makino, Oakazaki (JP); Norikazu Ohta, Aichi-ken (JP); Keiichi Shimaoka, Aichi-ken (JP); Hirofumi Funahashi, Aichi-ken (JP)

(73) Assignee: Denso Corporation, Kariya (JP)

( * ) Notice: Subject to any disclaimer, the term of this patent is extended or adjusted under 35 U.S.C. 154(b) by 115 days.

(21) Appl. No.: 10/189,599

(22) Filed: Jul. 8, 2002

(65) Prior Publication Data
US 2003/0011384 A1 Jan. 16, 2003

(30) Foreign Application Priority Data

Jul. 11, 2001 (JP) ........................................ 2001-211098

(51) Int. Cl.$^7$ .............................................. G01R 27/26
(52) U.S. Cl. ...................................... 324/661; 324/679
(58) Field of Search ................................. 324/661, 679

(56) References Cited

U.S. PATENT DOCUMENTS

| 5,751,154 A | 5/1998 | Tsugai |
| 6,326,795 B1 * | 12/2001 | Matsumoto et al. ........ 324/679 |

FOREIGN PATENT DOCUMENTS

| JP | 57-30908 | 2/1982 |
| JP | 5-223844 | 9/1993 |
| JP | 6-160429 | 6/1994 |
| JP | 9-264905 | 10/1997 |

* cited by examiner

Primary Examiner—Charles H. Nolan, Jr.
(74) Attorney, Agent, or Firm—Posz & Bethards, PLC

(57) ABSTRACT

First and second predetermined charging voltages are applied between the movable and fixed electrodes of a capacitive type of sensor to measure first and second capacitances between the movable and fixed electrodes, respectively. The first and second electrostatic capacitances are compared to obtain a characteristic of the sensor from a result of comparison. In measuring the first and second capacitances, first and second charging voltages are generated of which magnitudes are determined in accordance with the first and second capacitances, respectively. Equalization is made between the first output voltage when the first charging voltage is applied between the movable and fixed electrodes in a predetermined normal condition of the movable electrode and the second output voltage outputted when the second charging voltage is applied between the movable and fixed electrodes in the predetermined normal condition.

7 Claims, 4 Drawing Sheets

$C_{X2} = C_R \cdot V_{OUT}/(V_2 - V_{OUT})$ $C_{X1} = C_R \cdot V_{OUT}/(V_1 - V_{OUT})$ $C_{X2} = C_R \cdot V_{OUT}/(V_2 - V_{OUT})$ $C_{X1} = C_R \cdot V_{OUT}/(V_1 - V_{OUT})$

METHOD OF MEASURING A CHARACTERISTIC OF A CAPACITIVE TYPE OF SENSOR, A SENSOR CHARACTERISTIC MEASURING APPARATUS, A CAPACITIVE TYPE OF SENSOR APPARATUS, AND AN IC CHIP FOR MEASURING A SENSOR CHARACTERISTIC

BACKGROUND OF THE INVENTION

1. Field of the Invention

This invention relates to a method of measuring a characteristic of a capacitive type of sensor, a sensor characteristic measuring apparatus, a capacitive type of sensor apparatus, and an IC chip for measuring a sensor characteristic.

2. Description of the Prior Art

In the capacitive type of sensor having a fixed electrode and a movable electrode facing each other, the distance between the fixed electrode and the movable electrode may vary with passage of time. If the distance varies, the characteristic of the sensor varies also. Moreover, the sensor may become breakdown. Thus, it was desired to provide a technique for checking whether the capacitive type of sensor has a desired characteristic.

Japanese patent application provisional publication No. 6-160429 discloses a technique for judging whether the movable electrode contacts with the fixed electrode when a predetermined voltage is applied therebetween. Application of the predetermined voltage therebetween generates an electrostatic attracting force, so that the distance between the fixed and movable electrodes decreases. If the sensor does not have the desired characteristic, the movable electrode may contact with the fixed electrode before application of the predetermined voltage or may not contact with the fixed electrode when the predetermined voltage is applied. This provides judgment whether the sensor has a desired characteristic.

In this diagnostic operation, the movable electrode is subjected to deformation that is considerably larger than deformation during measurement of a physical quantity, so that the sensor may receive unrestorable deformation, and the life of the sensor may be shortened.

Accordingly, it is required to provide a diagnostic of the capacitive type of sensor without damage.

SUMMARY OF THE INVENTION

The aim of the present invention is to provide a superior method of measuring a characteristic of a capacitive type of sensor.

The aim of the present invention is to provide a superior sensor characteristic measuring apparatus.

The aim of the present invention is to provide a superior capacitive type of sensor apparatus.

The aim of the present invention is to provide a superior integrated chip for measuring a sensor characteristic.

According to the present invention, a first aspect of the present invention provides a method of measuring a characteristic of a capacitive type of sensor having a capacitor including a movable electrode and a fixed electrode facing each other comprising the steps of:

(a) applying a first predetermined voltage between said movable and fixed electrodes;

(b) measuring a first capacitance between said movable and fixed electrodes in condition of step (a);

(c) applying a second predetermined voltage between said movable and fixed electrodes;

(d) measuring a second capacitance of said capacitor in condition of step (c);

(e) effecting comparison between said first and second electrostatic capacitances; and (f) obtaining a characteristic of said sensor from a result of step (e).

According to the present invention, a second aspect of the present invention provides a sensor characteristic measuring apparatus for measuring a characteristic of a capacitive type of a sensor having a movable electrode and a fixed electrode facing each other comprising:

applying means for applying first and second predetermined voltages between said movable and fixed electrodes;

measuring means for measuring first and second capacitances between said movable and fixed electrodes when said applying means applies said first and second predetermined voltages between said movable and fixed electrodes, respectively;

comparing means for effecting comparison between said first and second electrostatic capacitances to obtain said characteristic.

According to the present invention, a third aspect of the present invention provides a sensor characteristic measuring apparatus based on the second aspect, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

According to the present invention, a fourth aspect of the present invention provides a capacitive type of sensor apparatus having a capacitive type of sensor including a capacitor having a movable electrode and a fixed electrode facing each other for measuring a physical quantity and measuring a characteristic of a capacitor comprising:

applying means for applying first and second predetermined voltages between said movable and fixed electrodes;

measuring means for measuring first and second capacitances between said movable and fixed electrodes when said applying means applies said first and second predetermined voltages between said movable and fixed electrodes, respectively; and comparing means for effecting comparison between said first and second electrostatic capacitances to obtain said characteristic.

According to the present invention, a fifth aspect of the present invention provides a capacitive type of sensor based on the fourth aspect, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

According to the present invention, a sixth aspect of the present invention provides an integrated circuit chip for measuring a characteristic of a capacitive type of a sensor having a movable electrode and a fixed electrode facing each other comprising:

applying means for applying first and second predetermined voltages between said movable and fixed electrodes;

measuring means for measuring first and second capacitances between said movable and fixed electrodes when said applying means applies said first and second predetermined voltages between said movable and fixed electrodes, respectively; and comparing means for effecting comparison between said first and second electrostatic capacitances to obtain said characteristic.

According to the present invention, a seventh aspect of the present invention provides an integrated circuit chip based on the sixth aspect, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

The present invention provides an improved method of measuring a characteristic of a capacitive type of sensor having a movable electrode and a fixed electrode facing each other. More specifically, the improved method includes steps of: (a) applying a first predetermined charging voltage between the movable and fixed electrodes; (b) measuring a first capacitance between the movable and fixed electrodes in condition of step (a); (c) applying a second predetermined charging voltage between the movable and fixed electrodes; (d) measuring a second capacitance between the movable and fixed electrodes in condition of step (c); (e) effecting comparison between the first and second electrostatic capacitances; and (f) obtaining a characteristic of the sensor from a result of step (e). Here, the first capacitance is compared with the second capacitance. More specifically, obtaining a difference, a ratio, a sum, or a product between the first and second capacitances, or obtaining a difference between squares of first and second capacitances provides the comparison. That is, comparison is provided to obtain a relation between the first and second capacitances.

The movable electrode may be formed variously, for example, in a diaphragm or a mass supported by a beam. If the flexibility of the diaphragm or the beam is higher than a desired value, the capacitance varies considerably on application of the predetermined charging voltage between the viable electrode and the fixed electrode. On the other hand, if the flexibility of the diaphragm or the beam is lower than a desired value, the capacitance varies slightly on application of the predetermined charging voltage. If the flexibility of the diaphragm or the beam is the desired value, the capacitance varies by a predetermined value on application of the predetermined charging voltage. Therefore, comparison between capacitances measured with different charging voltages provides information for judging the condition of the movable electrode of a capacitive type of a physical quantity sensor.

First Embodiment

Figure 1A:
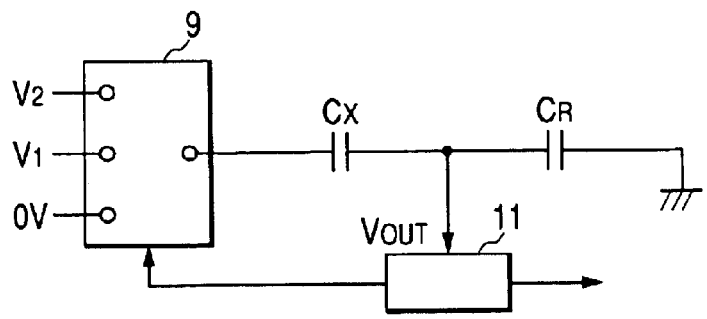
FIGS. 1A to 1G are illustrations for illustrating a first embodiment.

FIG. 1A is a block diagram of a sensor characteristic measuring apparatus according to a first embodiment.

The sensor characteristic measuring apparatus includes a switch 9 for supplying either of a charging voltage $V_1$, a charging voltage $V_2$, or a voltage of zero volts, a reference capacitor $C_R$, and a measuring device 11. More specifically, the output of the selector 9 is connected to a first end of a detection capacitor $C_X$ (to be measured) with a movable electrode and a fixed electrode. An opposite second end of the detection capacitor $C_X$ is connected to a first end of the reference capacitor $C_R$. The opposite second end of the reference capacitor $C_R$ is grounded. The output voltage $V_{OUT}$ at the junction point between the detection capacitor $C_X$ and the reference capacitor $C_R$ is supplied to the measuring device 11.

Figure 1B:
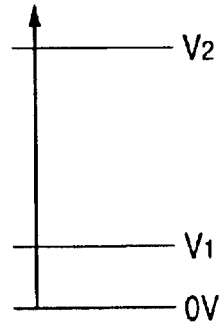

FIG. 1B shows the relation between the charging voltages $V_1$ and $V_2$. The charging voltage $V_2$ is larger than the charging voltage $V_1$ ($V_2 > V_1$).

Figure 1C:
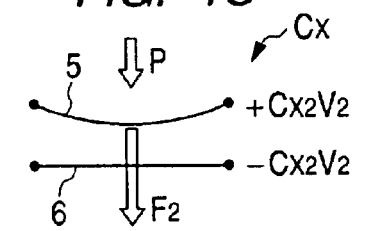
Figure 1D:
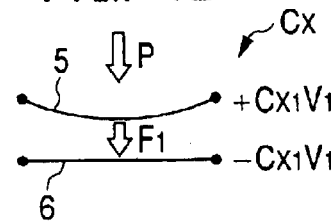

FIGS. 1C and 1D are illustrations of a diaphragm type of capacitive sensor in sectional views. The diaphragm type of sensor as an example of the capacitive type of sensor according to this invention is suitable for measuring a pressure. FIG. 1C shows the condition that the charging voltage $V_2$ is applied to the movable electrode 5 of the diaphragm type of detection capacitor $C_X$, and FIG. 1D shows the condition that the charging voltage $V_1$ is applied to the movable electrode 5 of the diaphragm type of detection capacitor $C_X$.

Figure 1E:
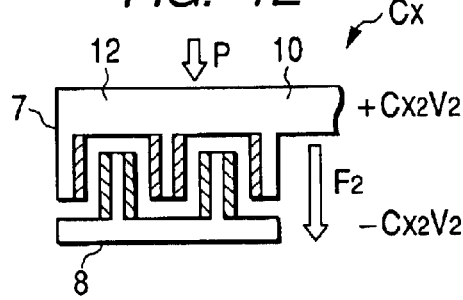
Figure 1F:
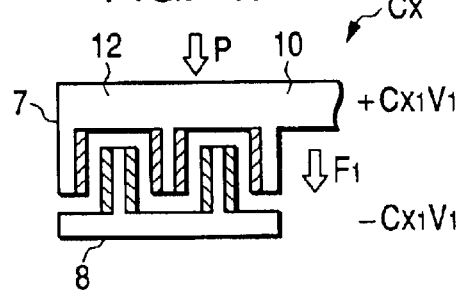

FIGS. 1E and 1F are illustrations of a beam type of capacitive type of sensor in sectional views. The beam type of sensor as an example of the capacitive type of sensor according to this invention is suitable for measuring acceleration. FIG. 1E shows the condition that the charging voltage $V_2$ is applied to the movable electrode 7 with a mass 12 supported by the beam 10, and FIG. 1F shows the condition that the charging voltage $V_1$ is applied to the movable electrode 7.

In FIGS. 1B (1E), when the charging voltage $V_2$ for charging the capacitor $C_X$ is applied to a series circuit including the detection capacitor $C_X$ and the reference capacitor $C_R$, charges of $C_{X2}$ $V_2$ in absolute values are developed at the movable electrode 5 (7) and the fixed electrode 6 (8). Then, an electrostatic attracting force $F_2$ is developed between the movable electrode 5 (7) and the fixed electrode 6 (8). Here, $C_{X2}$ represents the capacitance when a physical quantity P is applied to the movable electrode 5 and the electrostatic attracting force $F_2$ acts on the movable electrode 5 (7) and the fixed electrode 6 (8). The capacitance in this condition is given by:

$$C_{X2}=C_R \cdot V_{OUT}/(V_2-V_{OUT})$$

In FIG. 1D, when the charging voltage $V_1$ is applied to the series circuit, charges of $C_{X1}$ $V_1$ in absolute values are developed at the movable electrode 5 and the fixed electrode 6, and an electrostatic attracting force $F_1$ is developed between the movable electrode 5 and the fixed electrode 6. Here, $C_{X1}$ represents the capacitance when a physical quantity P is applied to the movable electrode 5 and the electrostatic attracting force $F_1$ acts on the movable electrode 5 and the fixed electrode 6. The capacitance is given by:

$$C_{X1}=C_R \cdot V_{OUT}/(V_1-V_{OUT}),$$

wherein $C_R$ represents a reference capacitance that does not vary with the physical quantity P or the electrostatic attracting force $F_1$. The capacitance $C_{X1}$ in FIG. 1F is similarly given.

Figure 1G:
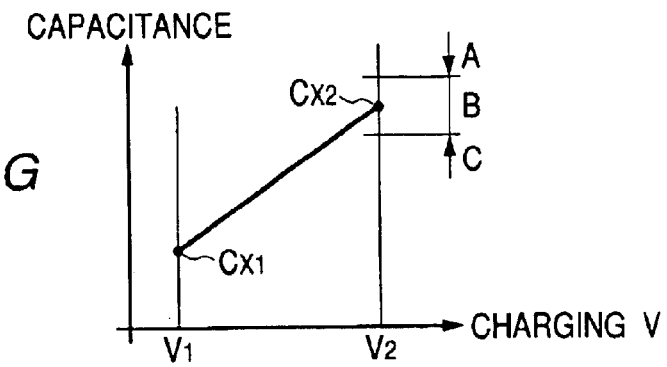

FIG. 1G illustrates variation in capacitance in accordance with the charging voltages $V_1$ and $V_2$.

If the diaphragm has a desired flexibility, then, $F_2>F_1$, and $C_{X2}>C_{X1}$. Moreover, the value of $C_{X2}-C_{X1}$ must be near a predetermined value. That is, in FIG. 1G, the capacitance $C_{X2}$ at the region B shows that the sensor has the desired flexibility. On the other hand, if the diaphragm has an excessive flexibility due to aged deterioration, the capacitance increases largely with increase in electrostatic attracting force from $F_1$ to $F_2$. If the capacitance $C_{X2}$ at the region A shows that the movable electrode 5 or 7 has flexibility greater than the desired value (too soft). If the diaphragm cannot be largely deformed due to a foreign object, the capacitance increases slightly. That is, if the capacitance $C_{X2}$ at the region C shows that the movable electrode 5 or 7 has a flexibility lower than the desired value.

In FIGS. 1E and 1F, if the voltage for measurement increases from $V_1$ to $V_2$, the electrostatic attracting force acting on the movable electrode 7 and the fixed electrode 8 increases, so that the movable electrode 7 attracted by the fixed electrode 8. This increases areas of the movable and fixed electrodes facing with each other, so that the capacitance increases. The flexibility of the beam 10 can be measured using two different charging voltages $V_1$ and $V_2$ through comparison between the measured capacitances $C_{X1}$ and $C_{X2}$.

The measuring unit 11 controls the switch 9 to supply the first predetermined charging voltage $V_1$ to the capacitor $C_X$ and measures a first capacitance $C_{X1}$ between the movable and fixed electrode 5 (7) AN D6 (8) while the first predetermined charging voltage $V_1$ is applied to the capacitor $C_X$. Next the measuring unit 11 applies the second predetermined charging voltage $V_2$ to the capacitor $C_X$ and measures the second capacitance $C_{X2}$ of the detection capacitor $C_X$ while the second predetermined charging voltage $V_2$ is applied to the detection capacitor $C_X$, and obtains a difference $(C_{X2}-C_{X1})$ to obtain a characteristic of the capacitive type of sensor. If the difference is within an allowable range B, it can be judged that the movable electrode 5 or 7 has no trouble.

Second Embodiment

Figure 2:
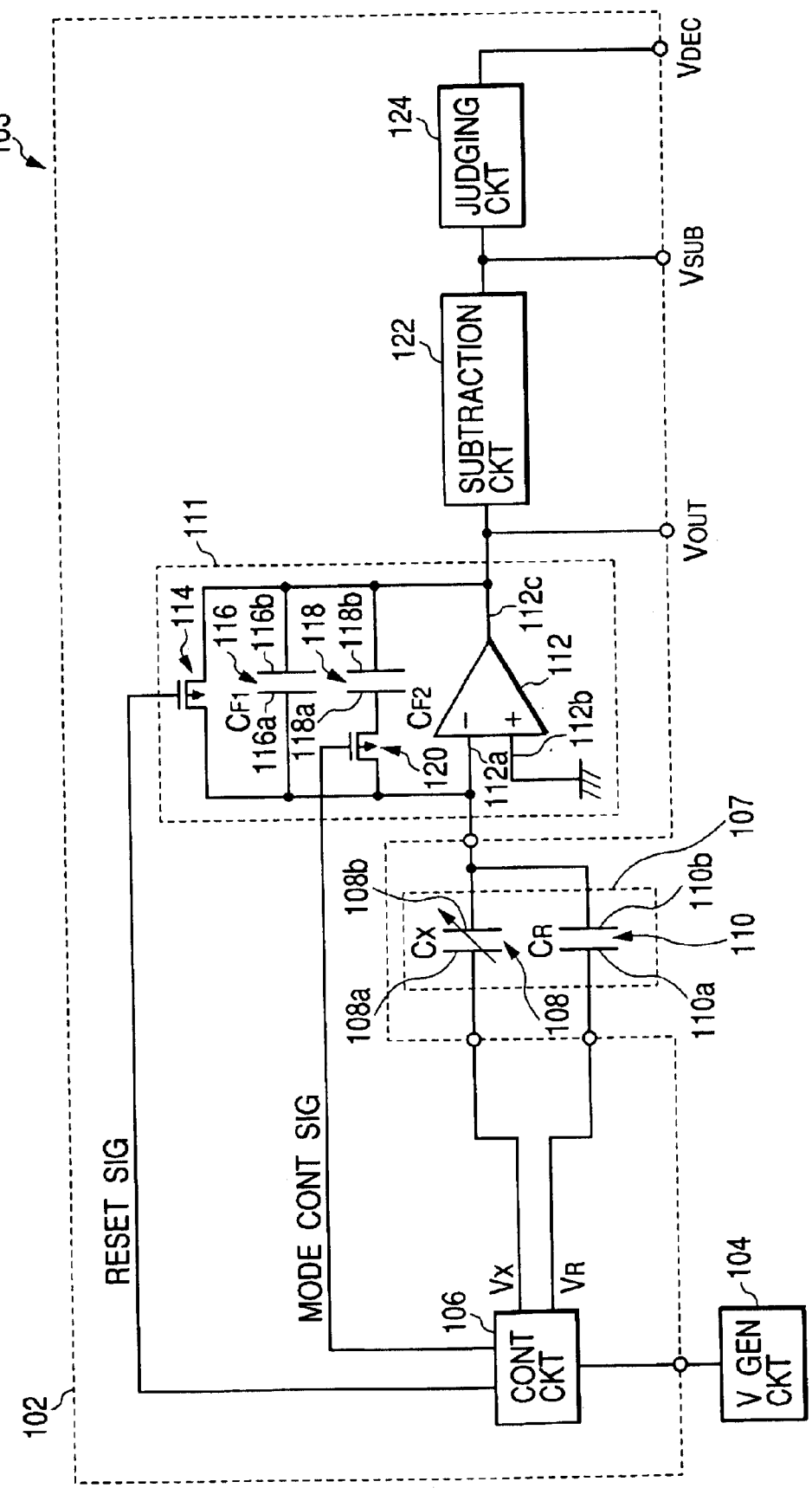
FIG. 2 is a block diagram of a sensor characteristic measuring apparatus according to a second embodiment.

FIG. 2 is a block diagram of a sensor characteristic measuring apparatus 102 according to a second embodiment. Here, the circuit configuration shown in FIG. 2 also provides a structure of a capacitive type of sensor apparatus 103 with a function for measuring characteristic of the capacitive sensor. That is, the sensor apparatus 103 has a function for measuring the characteristic of the capacitive sensor in addition to measure a physical quantity. However, the second embodiment will be described with the example of the sensor characteristic measuring apparatus because of the same operation.

The sensor characteristic measuring apparatus 102 according to the second embodiment measures a characteristic of the capacitive type of sensor 107 having a detection capacitor 108 for measuring a physical quantity and a reference capacitor 110. In addition, the sensor characteristic measuring apparatus can be used to measure a physical quantity.

The reference capacitor 110 is provided to measure the capacitance of the detection capacitor 108 that varies with a physical quantity applied thereto and with the charging voltage for charging the measurement of the physical quantity applied thereto. On the other hand, the capacitance of the reference capacitor 110 is subjected to almost no effect of the physical quantity and the charging voltage.

The detection capacitor 108 has a fixed electrode 108a and a movable electrode 108b, wherein a distance or a surface area facing the surface of the fixed electrode 108a varies with the physical quantity and the voltage applied thereto. The movable electrode 108b of the detection capacitor 108 is provided with a diaphragm that is flexible to be bent or a beam with a mass that is flexible to be bent.

The reference capacitor 110 has an upper electrode 110b and a lower electrode 110a.

Here, in the diaphragm type, the movable electrode 108b is formed at the center of the diaphragm, and the reference capacitor may be formed at a peripheral portion of the diaphragm.

As shown in FIG. 2, the sensor characteristic measuring apparatus 102 includes a control circuit 106, a capacitance detection circuit 111, a subtraction circuit 122, and a judging circuit 124. The control circuit 106 is supplied with a voltage from a voltage generation circuit 104 outside the circuit of the sensor characteristic measuring apparatus 102. The capacitive sensor 107 is connected between the control circuit 106 and the capacitance detection circuit 111.

The capacitance detection circuit 111 includes an operational amplifier 112, a reset switch 114, a first feedback capacitor 116, a second feedback capacitor 118, a mode switch 120. The capacitive type of sensor 107 has a detection capacitor 108 and a reference capacitor 110.

The control circuit 106 generates voltage signals having different magnitudes from the voltage from voltage generation circuit 104 and supplied the voltage signals to the fixed electrode 108a of the detection capacitor 108 and the lower electrode of the reference capacitor 110, respectively. Moreover, the control circuit 106 controls the gate of the mode switch 120 and the gate of a reset switch 114.

The inverting input 112a of the operational amplifier 112 in the capacitance detection circuit 111 is connected to the movable electrode 108b of the detection capacitor 108 and to an upper electrode 110b of the reference capacitor 110. Moreover, between the inverting input 112a and the output terminal 112c, a reset switch 114, the reset switch 114, a first feedback capacitor 116, a circuit including the mode switch 120 and the second feedback capacitor 118 connected in series are connected in parallel. The non-inverting input 112b is grounded.

The capacitance detection circuit 111 detects a difference in capacitance between the detection capacitor 108 and the reference capacitor 110 and output the voltage $V_{OUT}$ indicative of the difference in capacitance.

The voltage $V_{OUT}$ is supplied to the subtraction circuit 122 to obtain a difference between the output voltages $V_{OUT}$ of the operational amplifer 112 in respective modes controlled by the control circuit 106. More specifically, the subtraction circuit 122 temporally stores the output voltages of the operational amplifier 112 in respective modes, and obtains an absolute value of a difference voltage $V_{SUB}$ between the output voltages $V_{OUT}$ in respective modes.

The difference voltage $V_{SUB}$ of the subtraction circuit 122 is supplied to the judging circuit 124. The judging circuit 124 outputs an error detection signal $V_{DEC}$ when the difference voltage $V_{SUB}$ of the subtraction circuit 122 exceeds a threshold value.

The sensor characteristic measuring apparatus according to the second embodiment has the output terminals of the output voltage $V_{OUT}$, the difference voltage $V_{SUB}$, and the error detection signal $V_{DEC}$. Thus, waveforms at respective terminals can be observed with an oscilloscope or the like. Moreover, a control unit (not shown) can be connected to the control circuit 106 and to the judging circuit 124 to freely control the timings of switching the mode control signal, and the threshold value in the judgment circuit 124.

FIGS. 3A to 3G are time charts illustrating the operation of the sensor characteristic measuring apparatus 102, with assumption that the measurement is done for a capacitive type of sensor 107 having a diaphragm for the movable electrode 108b for measuring a pressure.

Figure 3:
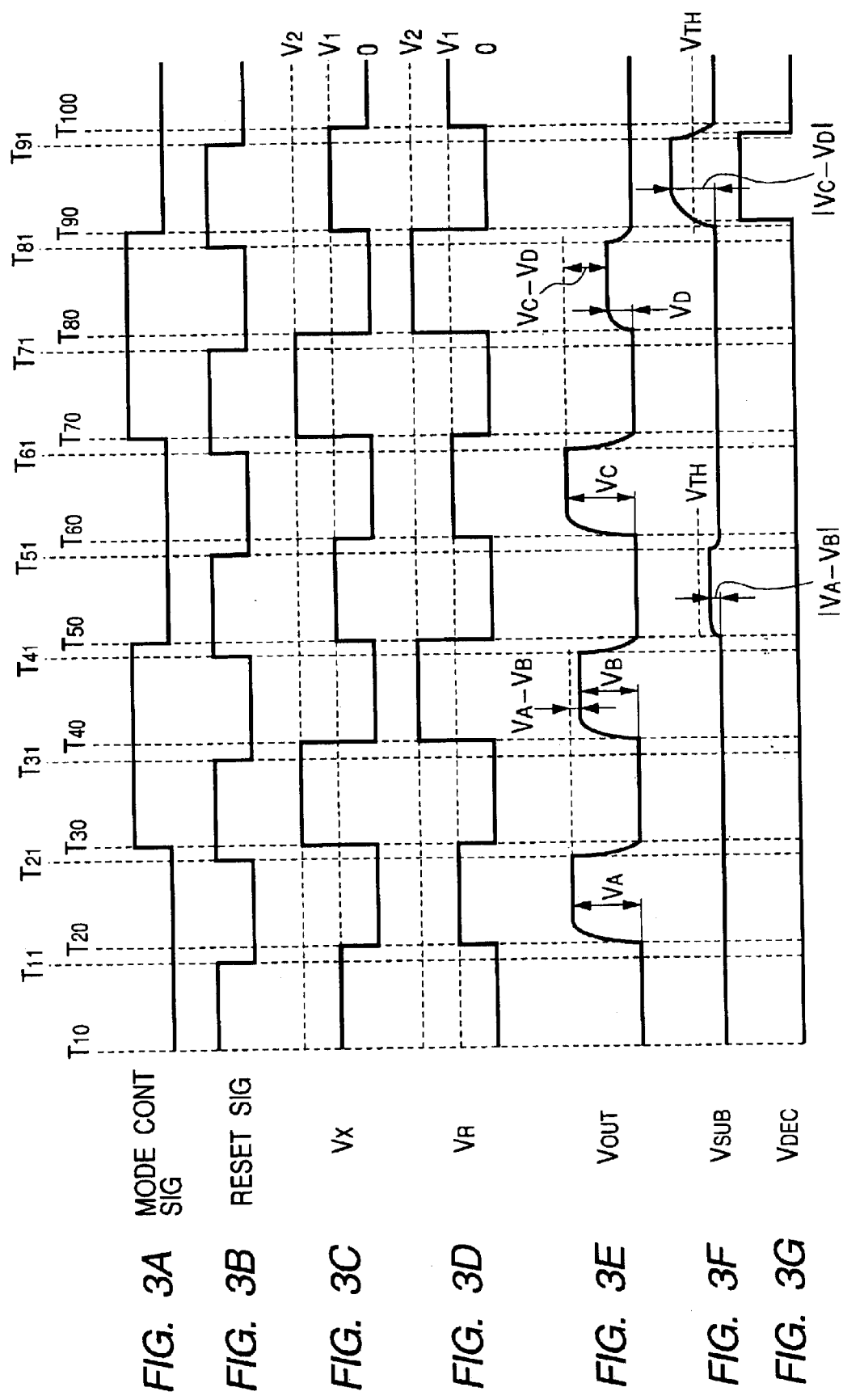
FIGS. 3A to 3G are time charts of the second embodiment.

FIG. 3A shows the mode control signal. The mode control signal indicates a first mode from timings $T_{10}$ to $T_{30}$ with a logic L level and alternately varies to indicate the first and second modes. In the first mode, because the mode control signal 106 is logic L, the mode switch 120 is turned off. Thus, the second feedback capacitor 118 is not connected between the inverting input 112a and the output terminal 112c of the operational amplifier 112. That is, in the first mode, only the first feedback capacitor 116 is connected between the inverting input 112a and the output terminal 112c of the operational amplifier 112.

On pressure measurement, only the first mode is used.

The voltage signal $V_X$ is applied to the detection capacitor 108 from the control circuit 106 as a square wave of which high level is $V_1$ (first predetermined charging voltage) in the first mode at timing $T_{10}$ as shown in FIG. 3C. For the following second mode interval, the level of the voltage signal $V_X$ becomes zero volts at timing $T_{20}$. As the voltage signals $V_X$ and $V_R$ have an inverted relation therebetween as show nin FIGS. 3C and 3D, the voltage signal $V_R$ applied to the reference capacitor 110 becomes a low level (zero volt) at the timing $T_{10}$ and rises to $V_1$ at the timing $T_{20}$.

At timing $T_{10}$, the control circuit 106 supplies a high level (first predetermined charging voltage $V_1$) of the voltage signal $V_X$ to the detection capacitor 108. The control circuit 106 changes the voltage signal $V_X$ to zero volts from $V_1$ at timing $T_{20}$. On the other hand, at timing $T_{10}$, a low level (zero volts) of the voltage signal $V_R$ is inputted to the reference capacitor 110, and at timing $T_{20}$, the detection voltage $V_R$ becomes $V_1$ from zero volts.

Therefore, at timing $T_{10}$, a charge $C_{X1}V_1$ is stored in the detection capacitor 108. Next, at the timing $T_{20}$, the charges $C_{X1}V_1$ stored in the detection capacitor 108 are discharged. At the same time, charges $C_R V_1$ are stored in the reference capacitor 110. Here, $C_{X1}$ represents a capacitance of the detection capacitor 108 while the charging voltage $V_1$ is applied to the detection capacitor 108, that is, a capacitance when the diaphragm bent by the pressure applied thereto and the electrostatic attracting force due to application of the charging voltage $V_1$. On the other hand, $C_R$ represents a capacitance of the reference capacitor 110 that is unchanged by the pressure and the electrostatic attracting force between the uppers and lower electrodes.

At timing $T_{20}$, charge of $-C_{X1}V_1 + C_R V_1 = -(C_{X1} - C_R) V_1$ is stored at the electrode 116a of the first feedback capacitor 116. Here, if it is assumed that the output voltage $V_{OUT}$ of the operational amplifier 112 in the first mode is $V_A$ and the capacitance of the first feedback capacitor 116 is $C_{F1}$, then, $V_A = (C_{X1} - C_R)V_1/C_{F1}$. Thus, $C_{X1} = V_A C_{F1}/V_1 + C_R$ is given.

Here, $C_R$ represents the capacitance of the reference capacitor 110 that is not subjected to effect by the pressure and the electrostatic attracting force between the upper and the lower electrodes 110b and 110a, and thus, $C_R$ is a known value. Then, values of $C_{F1}$, $V_1$, and $C_R$ are known, and the value $V_A$ is measured at the terminal $V_{OUT}$, so that the value of $C_{X1}$ can be determined in the first mode.

The output voltage $V_A$ of the operational amplifier 112 appearing after the timing $T_{20}$ represents a difference between the capacitance $C_{X1}$ of the detection capacitor 108 and the capacitance $C_R$ of the reference capacitor 110 in the condition that the diaphragm is bent by a pressure and an electrostatic attracting force by application of the charging voltage $V_1$ acting on both electrodes. In other wards, the output voltage $V_A$ represents a relation of the capacitance of the detection capacitor 108 to the capacitance $C_R$ of the reference capacitor 110.

At timing $T_{21}$, the reset signal becomes high, so that the reset switch 114 turns on. This makes a short circuit between the inverting input 112a and the output terminal 112c of the operational amplifier 112. As a result, the charge stored at the first feedback capacitor 116 is discharged, and the output voltage $V_{OUT}$ becomes zero volts at timing $T_{30}$, as shown in FIG. 3E.

The mode control signal indicates the second mode from the timings $T_{30}$ to $T_{50}$. In the second mode, the mode control switch 120 turns on, so that the second feedback capacitor 118 is connected between the inverting input 112a and the output terminal 112c. That is, in the second mode, the first feedback capacitor 116 and the second feedback capacitor 118 are connected between the inverting input 112a and the output terminal 112c in parallel.

The control circuit 106 periodically switches the mode between the first and second modes while the characteristic of the sensor 107 is measured. Thus, time charts in FIGS. 3A to 3G represent this measuring condition.

In the second mode, the voltage signal $V_X$ is applied to the detection capacitor 108 from the control circuit 106 to have a square wave of which high level is $V_2$ (second predetermined charging voltage which is higher than the first predetermined voltage). Thus, the level of the voltage signal $V_X$ becomes zero volts at a timing $T_{40}$.

The voltage signal $V_R$ applied to the reference capacitor 110 has a voltage of $V_2$ (second predetermined charging voltage) at a high level thereof and zero voltage at a low level thereof to have a square wave in the second mode. As the voltage signal $V_R$ is low when the voltage signal $V_X$ is at a high level, from timings $T_{40}$ to $T_{50}$, the voltage signal $V_R$ is at a high level.

At timing $T_{30}$, the control circuit 106 supplies a high level (second predetermined charging voltage $V_2$) of the voltage signal $V_X$ to the detection capacitor 108. At the timing $T_{40}$, the control circuit 106 changes the voltage signal $V_X$ to zero volts from $V_2$. On the other hand, because the voltage signal $V_X$ and the voltage signal $V_R$ have an inverted relation, at timing $T_{30}$, a low level (zero volt) of the voltage signal $V_R$ is inputted to the reference capacitor 110, and at timing $T_{40}$, the detection voltage $V_R$ becomes $V_2$ from zero volts.

Therefore, the charge $C_{X2}V_2$ is stored in the detection capacitor 108. Next, at the timing $T_{40}$, the charge $C_{X2}V_2$ stored in the detection capacitor 108 is discharged. At the same time (at timing $T_{40}$), charge $C_{R2}V_2$ is stored in the reference capacitor 110.

Thus, the charge of $-C_{X2}V_2$ stored at the movable electrode 108b of the detection capacitor 108 moves to the lower electrode 116a of the first feedback capacitor 116 and to the lower electrode 118a of the second feedback capacitor 118. Moreover, charge of $C_RV_2$ stored at the upper electrode 110b of the reference capacitor 110 moves to the lower electrode 116a of the first feedback capacitor 116 and to the lower electrode 118a of the second feedback capacitor 118.

As a result, at the lower electrode 116a of the first feedback capacitor 116 and at the lower electrode 118a of the second feedback capacitor 118, a total charge of $-C_{X1}V_2+C_RV_2=-(C_{X2}-C_R)V_2$ is charged. If it is assumed that the output voltage $V_{OUT}$ of the operational amplifier 112 in the second mode is $V_B$, $V_B=(C_{X2}-C_R)V_2/(C_{F1}+C_{F2})$. From this equation, $C_{X2}=V_B(C_{F1}+C_{F2})/V_2+C_R$.

The output voltage $V_B$ of the operational amplifier 112 appearing after the timing $T_{40}$ represents a difference between the capacitance $C_{X2}$ of the detection capacitor 108 and the capacitance $C_R$ of the reference capacitor 110 in the condition that the diaphragm is bent by a pressure and an electrostatic attracting force by application of the charging voltage $V_2$ acting on both electrodes. In other wards, the output voltage $V_B$ represents a relation of the capacitance of the detection capacitor 108 to the capacitance $C_R$ of the reference capacitor 110.

At timing T41, the reset signal becomes high, so that the reset switch 114 turns on. This makes a short circuit between the inverting input 112a and the output terminal 112c of the operational amplifier 112. As a result, the charge of $C_{X1}V_2$ stored at the first feedback capacitor 116 and the second feedback capacitor 118 is gradually discharged, and the output voltage $V_{OUT}$ becomes zero volts at timing T50.

The characteristic of the diaphragm is represented with various indexes. The most essential one represents the characteristic of the diaphragm using the difference between $C_{X2}$ and $C_{X1}$.

In addition, the difference between $V_A=(C_X-C_R)V_1/C_{F1}$ and $V_B=(C_{X2}-C_R)V_2/(C_{F1}+C_{F2})$ can represent the characteristic of the diaphragm. In this case, the characteristic of the movable electrode 108b is given by $V_B-V_A=C_{X2}V_2/(C_{F1}+C_{F2})-C_{X1}V_1/C_{F1}$+a constant. Thus, the more flexible diaphragm, the larger this value.

In the sensor characteristic measuring apparatus according to the second embodiment, the values of $C_{F1}$, $C_{F2}$, $V_1$, and $V_2$ are determined to make $V_B-V_A=0$ (equalizing the output voltage $V_A$ to $V_B$) when the diaphragm has a desired flexibility.

The subtraction circuit 122 records $V_A$ just before the timing $T_{21}$ and calculates $V_B-V_A$ just before the timing $T_{41}$. Next, from timings $T_{50}$ to $T_{60}$, the subtraction circuit 122 supplies the difference voltage $V_{SUB}$ indicating the absolute value of $V_A-V_B$ to the judging circuit 124.

The interval from the timings $T_{20}$ to $T_{50}$ is very short, so that the value of the pressure can be assumed to be substantially unchanged. Thus, subtraction between the output voltage $V_A$ in the first mode and the output voltage $V_B$ in the second mode cancels the effect by the pressure. Moreover, as mentioned above, if there is no trouble in the sensor, the values of $C_{F1}$, $C_{F2}$, $V_1$, and $V_2$ are determined to make $V_{SUB}=|V_A-V_B|$ almost zero when the diaphragm has a desired flexibility.

The difference voltage $V_{SUB}=|V_A-V_B|$ outputted by the subtraction circuit 122 is supplied to the judging circuit 124. The judging circuit 124 does not output an error signal $V_{DEC}$ when the difference signal $V_{SUB}$ is equal to or lower than a threshold value $V_{TH}$. In FIG. 3G, from timings $T_{50}$ to $T_{60}$, the value of $V_{SUB}$ is always lower than the $V_{TH}$, so that the error signal $V_{DEC}$ is not outputted.

From timings $T_{50}$ to $T_{90}$, the mode control signal alternately indicates the first and second modes, wherein from timings $T_{60}$ to $T_{70}$, an example operation is shown. That is, from timings $T_{60}$, to $T_{70}$, the output voltage $V_{OUT}$ in the first mode becomes $V_C$, and the output voltage $V_{OUT}$ in the second mode from timings $T_{80}$ to $T_{90}$ biomes $V_D$. Then, as shown from timings $T_{90}$ to $T_{100}$, the difference voltage $V_{SUB}$ of the subtraction circuit 122 becomes larger than $V_{TH}$, so that the judging circuit 124 outputs the error signal $V_{DEC}$.

If the diaphragm has a desired characteristic, the output voltage $V_A$ in the first mode is approximately equal to the output voltage $V_B$ in the second mode. If $V_{SUB}=|V_A-V_B|<V_{TH}$, this indicates that the diaphragm has the desired characteristic.

If the diaphragm has a higher flexibility than the desired value, then, $V_B-V_A>V_{TH}$. Thus, if $V_B-V_A>V_{TH}$, the diaphragm is judged to be more flexible. On the other hand, if the diaphragm has a lower flexibility than the desired value, $V_B-V_A<-V_{TH}$. Thus, if $V_B-V_A<-V_{TH}$, the diaphragm is judged to have a lower flexibility than the desired value.

If voltages at the output terminals of the sensor characteristic measuring apparatus 102 according to the second embodiment are observed with an oscilloscope or the like, waveforms of $V_{OUT}$, $V_{SUB}$, and $V_{DEC}$ should be shown as shown in FIGS. 3A to 3G.

Observing the output voltage $V_{OUT}$ of the capacitance detection circuit 111, i.e., observing waveforms in the first mode (lower charging voltage $V_1$ is applied to the detection capacitor 108) and waveforms in the second mode (a larger charging voltage $V_2$ is applied to the detection capacitor 108) provides information of the condition of the movable electrode 108b. Thus studying and judging the voltage values and transition at respective voltage waveforms provides more information of the characteristics of the sensor 107.

Moreover, the waveforms of the output voltage $V_{OUT}$ in the first and second modes are equalized, so that the waveforms in the first and second modes can be easily compared with each other.

Further, if the voltage waveform of the output voltage $V_{OUT}$ in the first mode is extremely large, this indicates that a crack or scratch may be developed at a high probability because though the smaller voltage $V_1$ is applied to the detection capacitor 108, this indicates that the diaphragm or a beam supporting the movable electrode 108a largely deforms.

Moreover, if the waveform of the output voltage $V_{OUT}$ in the second mode is extremely low, this indicates that a foreign object enters the space between the electrodes because this indicates the diaphragm or the beam cannot be deformed though the larger charging voltage $V_2$ is applied to the detection capacitor 108.

The difference voltage $V_{SUB}$ of the subtraction circuit 122 provides an absolute difference in the voltage waveforms in the first and second modes, so that this provides easy compression between the voltage waveforms in the first and second modes. Particularly, examination of the output voltages $V_{OUT}$ and the difference voltage $V_{SUB}$ is useful for final checking the sensor 107 in the manufacturing process and for adjustment of sensitivity of the sensor 107 without directly applying a pressure to the sensor 107.

The error signal $V_{DEC}$ from the judging circuit 124 informs of the error condition indicating that the difference voltage $V_{SUB}$ is higher than the threshold value $V_{TH}$, so that this speeds up and ensures replacement or trouble shooting of the sensor 107.

Moreover, according to the second embodiment, the movable electrode 108b is not subjected to an extremely large deformation or extremely large stress, so that the life of the diaphragm or the beam can be elongated.

The second embodiment has a higher accuracy in detection of the variation in the capacitance than the first embodiment.

Modifications

This invention is applicable to various capacitive type of physical quantity sensors such as a capacitive type of pressure sensor, an inertia sensor, a vibration sensor, and a sound presser sensor. Moreover, in the second embodiment, the subtraction circuit 122 for comparing the output voltage $V_A$ in the first mode with the output voltage $V_B$ in the second mode was used. However, it is also possible to use either of a circuit for obtaining a ratio between the voltages $V_A$ and $V_B$, a circuit for obtaining a sum or a product between the voltage $V_A$ and $V_B$, or a circuit obtaining a difference between squares of the output voltages $V_A$ and $V_B$ as the comparing circuit to output the error signal from the judging circuit 124 when the output of the comparing circuit is not a predetermined value or outside a predetermined allowable range.

Moreover, the sensor characteristic measuring apparatus 102 may be produced in one body with the capacitive type of sensor.

Figure 4:
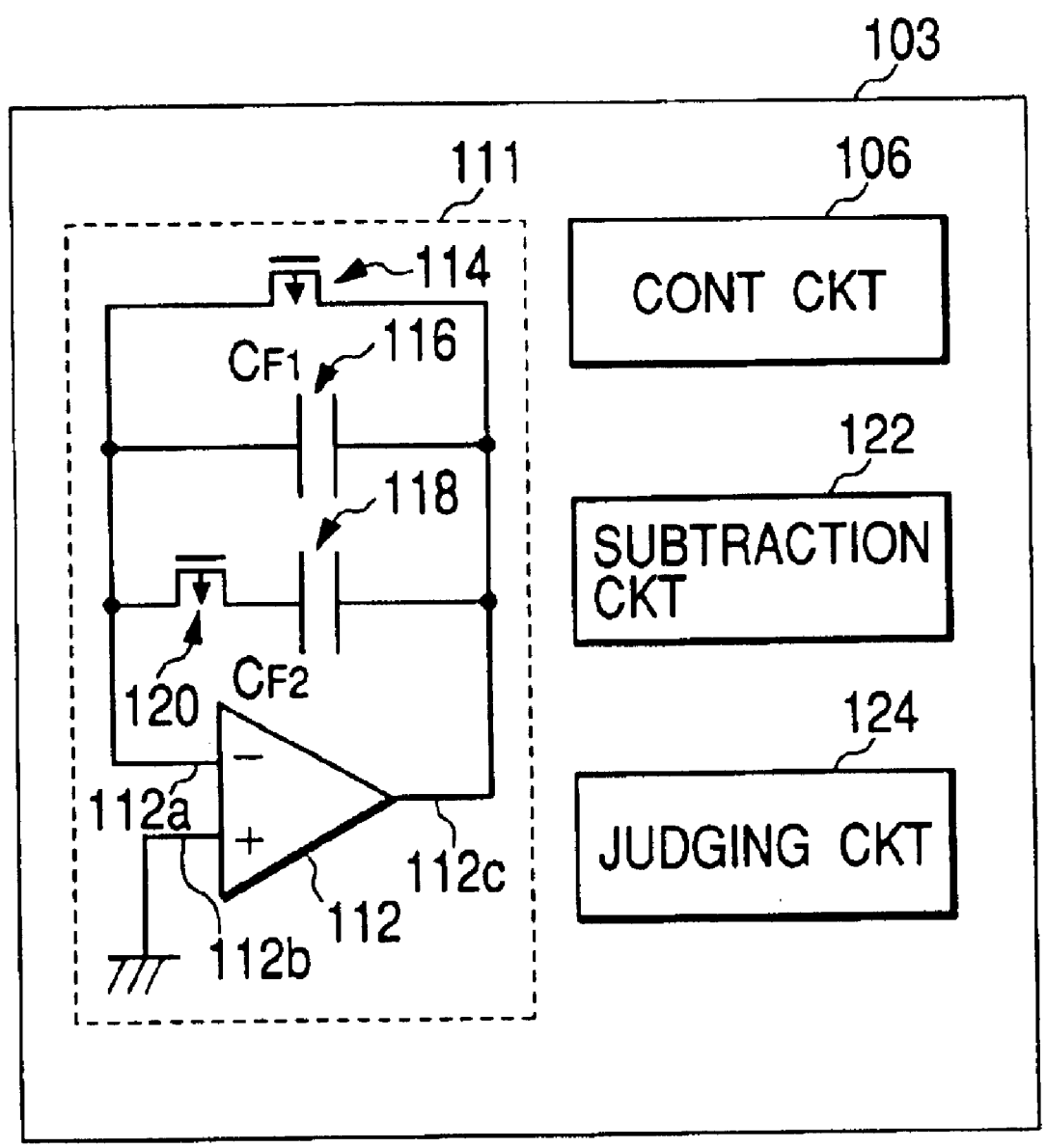
FIG. 4 is a block diagram of an integrated circuit including a sensor characteristic measuring apparatus.

Further, the sensor characteristic measuring apparatus may be produced in an integrated circuit chip 103 as shown in FIG. 4.

Moreover, in the above-mentioned embodiments, the characteristic of the sensor 107 was measured with the first and second predetermined charging voltages $V_1$ and $V_2$. However, the characteristic of the sensor may be measured with one predetermined $V_2$ which is larger than the charging voltage $V_1$ used for measuring the physical quantity. More specifically, in FIG. 1G, when the charging voltage $V_2$ is applied to the movable electrode 108b and the fixed electrode 108a, if the detected capacitance is outside the rage B, that is, exists in the range A or C, the characteristic of the sensor can be judged to be improper. In other words, this invention also provides a method of measuring a characteristic of a capacitive type of a sensor having a capacitor including a movable electrode and a fixed electrode facing each other comprising the steps of:

(a) applying a predetermined voltage to the capacitor, the predetermined voltage being larger than a measurement voltage applied to the capacitor to measure a physical quantity applied to the movable electrode;

(b) measuring a capacitance between the movable and fixed electrodes in condition of step (a);

(c) comparing the capacitance with a reference; and (d) obtaining a characteristic of the sensor from a result of step (c), wherein the reference may be a value or an allowable range values indicating the rage B in FIG. 1G.

What is claimed is:

1. A method of measuring a characteristic of a capacitive type of sensor having a capacitor including a movable electrode and a fixed electrode facing each other comprising the steps of:

(a) applying a first predetermined voltage between said movable and fixed electrodes;

(b) measuring a first capacitance between said movable and fixed electrodes in condition of step (a);

(c) applying a second predetermined voltage between said movable and fixed electrodes;

(d) measuring a second capacitance of said capacitor in condition of step (c);

(e) effecting comparison between said first and second electrostatic capacitances; and (f) obtaining a characteristic of said sensor from a result of step (e).

2. A sensor characteristic measuring apparatus for measuring a characteristic of a capacitive type of a sensor having a movable electrode and a fixed electrode facing each other comprising:

applying means for applying first and second predetermined voltages between said movable and fixed electrodes;

measuring means for measuring first and second capacitances between said movable and fixed electrodes when said applying means applies said first and second predetermined voltages between said movable and fixed electrodes, respectively; and comparing means for effecting comparison between said first and second electrostatic capacitances to obtain said characteristic.

3. The sensor characteristic measuring apparatus as claimed in claim 2, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

4. A capacitive type of sensor apparatus having a capacitive type of sensor including a capacitor having a movable electrode and a fixed electrode facing each other for measuring a physical quantity and measuring a characteristic of a capacitor comprising:

applying means for applying first and second predetermined voltages between said movable and fixed electrodes;

measuring means for measuring first and second capacitances between said movable and fixed electrodes when said applying means applies said first and second predetermined voltages between said movable and fixed electrodes, respectively; and comparing means for effecting comparison between said first and second electrostatic capacitances to obtain said characteristic.

5. The capacitive type of sensor as claimed in claim 4, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

6. An integrated circuit chip for measuring a characteristic of a capacitive type of a sensor having a movable electrode and a fixed electrode facing each other comprising:

applying means for applying first and second predetermined voltage between said movable and fixed electrodes;

measuring means for measuring first and second capacitances between said movable and fixed electrodes when said applying means applies said first and second predetermined voltages between said movable and fixed electrodes, respectively; and comparing means for effecting comparison between said first and second electrostatic capacitances to obtain said characteristic.

7. The integrated circuit chip as claimed in claim 6, wherein said measuring means comprises first and second voltage signal generation means for generating first and second voltage signals of which magnitudes are determined in accordance with said first and second capacitances, respectively and equalizing means for effecting equalization between said first voltage signal outputted when said first predetermined voltage is applied between said movable and fixed electrodes in a predetermined normal condition of said movable and fixed electrodes and said second voltage signal outputted when said second predetermined voltage is applied between said movable and fixed electrodes in said predetermined normal conditions of said movable and fixed electrodes.

* * * * *

UNITED STATES PATENT AND TRADEMARK OFFICE
CERTIFICATE OF CORRECTION

PATENT NO. : 6,809,527 B2
DATED : October 26, 2004
INVENTOR(S) : Seiichiro Ishio et al.

It is certified that error appears in the above-identified patent and that said Letters Patent is hereby corrected as shown below:

<u>Title page</u>,
Item [75], Inventors, last name of seventh inventor should read -- Funabashi --

Signed and Sealed this

Eighth Day of February, 2005

JON W. DUDAS
*Director of the United States Patent and Trademark Office*